(12) United States Patent
Yeh et al.

(10) Patent No.: US 11,729,917 B2
(45) Date of Patent: Aug. 15, 2023

(54) METHOD FOR OPTIMIZED FILLING HOLE AND MANUFACTURING FINE LINE ON PRINTED CIRCUIT BOARD

(71) Applicants: TRIALLIAN CORPORATION, New Taipei (TW); Albert Yeh, New Taipei (TW)

(72) Inventors: Albert Yeh, New Taipei (TW); Nick Yang, New Taipei (TW)

(73) Assignees: TRIALLIAN CORPORATION, New Taipei (TW); Albert Yeh, New Taipei (TW)

( * ) Notice: Subject to any disclaimer, the term of this patent is extended or adjusted under 35 U.S.C. 154(b) by 55 days.

(21) Appl. No.: 17/376,537

(22) Filed: Jul. 15, 2021

(65) Prior Publication Data

US 2022/0295645 A1 Sep. 15, 2022

(30) Foreign Application Priority Data

Mar. 11, 2021 (TW) ................................. 110108773

(51) Int. Cl.
*C25D 5/02* (2006.01)
*H05K 3/42* (2006.01)
*C25D 3/38* (2006.01)
*C25D 7/00* (2006.01)
*C25D 5/18* (2006.01)
*H05K 3/18* (2006.01)
*H05K 3/00* (2006.01)
*C25D 5/56* (2006.01)

(52) U.S. Cl.
CPC ............... *H05K 3/423* (2013.01); *C25D 3/38* (2013.01); *C25D 5/02* (2013.01); *C25D 5/18* (2013.01); *C25D 5/56* (2013.01); *C25D 7/00* (2013.01); *H05K 3/0047* (2013.01); *H05K 3/188* (2013.01)

(58) Field of Classification Search
None
See application file for complete search history.

(56) References Cited

U.S. PATENT DOCUMENTS

| 2009/0133910 | A1* | 5/2009 | Ohashi | H05K 3/02 205/160 |
| 2016/0353584 | A1* | 12/2016 | Honda | H05K 3/426 |
| 2017/0130354 | A1* | 5/2017 | Nishigawa | H05K 3/467 |
| 2018/0368266 | A1* | 12/2018 | Yeh | H05K 3/06 |

FOREIGN PATENT DOCUMENTS

| TW | I618821 B | 3/2018 | |
| TW | I628989 B | 7/2018 | |
| TW | 201914384 | * 4/2019 | H05K 3/12 |

* cited by examiner

*Primary Examiner* — Stefanie S Wittenberg
(74) *Attorney, Agent, or Firm* — Pai Patent & Trademark Law Firm; Chao-Chang David Pai

(57) ABSTRACT

A method for optimized filling holes and manufacturing fine lines on a printed circuit board (PCB) carries out the two processes separately. The inner wall of the hole is metalized with reduced graphene oxide (rGO) and then electroplated to fill the hole with copper. The processes are individually performed and thus operating parameters are considered independently. As a result, the copper-plating fillings are evenly compact and the fine lines have square profiles.

11 Claims, 11 Drawing Sheets

(c)

(d1)

(d2)

METHOD FOR OPTIMIZED FILLING HOLE AND MANUFACTURING FINE LINE ON
PRINTED CIRCUIT BOARD

BACKGROUND OF THE INVENTION

1. Field of the Invention

This invention relates to a method for optimized filling holes and manufacturing fine lines on a printed circuit board (PCB). Particularly, the procedures of filling holes and manufacturing lines are carried out separately.

2. Description of Related Art

A printed circuit board (PCB) primarily includes an insulative substrate on which conductor lines and electrical elements are connected to achieve desired functions. In order to realize devices having more functions and smaller sizes, the multi-layer substrates are designed to arrange more fine lines. However, the high density interconnect (HDI) technologies for the PCBs are not satisfactory in accomplishing it. For example, the subtractive process resulting in side-etching could not manufacture the lines having an aspect less than 50 μm, and the semi-additive process (SAP) could not achieve the surface of copper plating with high conformity.

To solve the above shortages, the present invention provides a method for optimized filling holes and manufacturing fine lines on PCBs.

SUMMARY OF THE INVENTION

This invention provides a method for optimized filling holes and manufacturing fine lines on a printed circuit board (PCB) whereby conformity of the overall board is improved and mechanisms of filling holes and manufacturing fine lines are optimized.

The method for optimized filling holes on a printed circuit board comprises steps of: (a) providing a copper clad substrate including a prepreg layer overlaid with a copper foil and a first dry film laminated on the copper foil, on which a blind hole with an insulative inner wall is formed at a predetermined position and defines an upper opening, wherein the first dry film is patterned corresponding to the upper opening and insoluble in a non-alkaline solution; (b) modifying the insulative inner wall of the blind hole with reduced graphene oxide (rGO); (c) depositing copper in the blind hole through an electroplating process; (d) removing the first dry film to expose the copper foil; and (e) removing the exposed copper foil.

In this invention, the procedures of filling holes and manufacturing fine lines are separately performed. The first dry film used for filling holes has no circuit patterns therein. Additionally, there are only holes on the copper clad substrate without trenches for depositing copper of fine lines.

In step (a), the blind hole can be formed by the following steps of: providing a copper clad substrate including a prepreg layer overlaid with a copper foil, and then drilling a hole at a predetermined position of the copper clad substrate, and the hole has an insulative inner wall and defines an upper opening; and laminating a first dry film which is insoluble in a non-alkaline solution on the copper foil and patterning the first dry film corresponding to the upper opening to form the blind hole. Between the above two steps, fine lines can be further manufactured by laminating a second dry film on the copper foil and form a circuit pattern corresponding to designed fine lines, then depositing copper in the circuit pattern through an electroplating process, and then removing the second dry film.

Alternatively, for a core copper clad substrate, the blind hole of step (a) can be formed by steps of: providing a copper clad substrate including a prepreg layer overlaid with copper foils on opposite surfaces thereof and drilling a through hole with a lower opening or a blind hole with a bottom at a predetermined position; laminating second dry films on the copper foils and patterning the second dry film corresponding to an edge of the lower opening or the bottom; depositing copper on the edge of the lower opening or in the bottom through an electroplating process; removing the second dry films; and laminating the first dry film on the copper foils and patterning the first dry film corresponding to the upper opening to form the blind hole. Preferably, the first dry film is patterned to expose an edge of the copper foil around the upper opening, and copper is deposited on the edge of the upper opening in the step (c). The second dry film can be also patterned corresponding to designed fine lines, and copper is also deposited in the circuit pattern through the electroplating process.

Optionally, the blind hole of step (a) can be formed by steps of: providing a copper clad substrate including a prepreg layer overlaid with a copper foil; laminating the first dry film on the copper foil; and drilling a hole at a predetermined position.

Preferably, the electroplating process of step (a) is a vertical PPR (Periodic Pulse Reverse) plating process.

Preferably, the above step (b) is to form a polymer layer on the first dry film and the insulative wall of the blind hole, then modify the polymer layer with graphene oxide (GO), and finally reduce the GO to form a reduced GO (rGO) layer.

The copper of step (c) is usually deposited on the rGO layer on the first dry film to form a surface copper layer. Therefore, the surface copper layer is first removed in step (d) to expose the rGO layer on the first dry film and then the first dry film and the rGO layer thereon are stripped or removed.

To complete fine lines in this invention, the step (e) can further comprise steps of: laminating a second dry film on the copper foil and forming a non-conductive pattern by masking area required to be conductive; removing the copper foil in the non-conductive pattern; and removing the second dry film.

In this invention, a preferred process for optimized filling holes and manufacturing fine lines on a printed circuit board comprises steps of: (a1) providing a copper clad substrate including a prepreg layer overlaid with a copper foil and drilling a hole at a predetermined position, wherein the hole has an upper opening with an insulative inner wall; (a2) laminating a second dry film on the copper foil and forming a circuit pattern corresponding to designed fine lines; (a3) depositing copper in the circuit pattern through an electroplating process, preferably the vertical PPR plating process; (a4) removing the second dry film; (a5) laminating the first dry film on the copper foil and patterning the first dry film corresponding to the upper opening to form a blind hole, in which the first dry film is insoluble in a non-alkaline solution; (b) modifying the insulative inner wall of the blind hole with reduced graphene oxide (rGO); (c) depositing copper in the blind hole through an electroplating process; (d) removing the first dry film; and (e) removing exposed copper foil.

Particularly, when the copper clad substrate is a core layer, then step (a1) is to provide a copper clad substrate including a prepreg layer overlaid with copper foils on opposite surfaces thereof and drill a through hole with a lower opening or a blind hole with a bottom at a predetermined position; step (a2) is to laminate a second dry film on the copper foils and pattern the second dry film corresponding to an edge of the lower opening or the bottom; and step (a3) is to deposit copper on the edge of the lower opening or in the bottom through an electroplating process. Steps (b), (c) and (d) are similar to the aforementioned.

DETAILED DESCRIPTION OF THE PREFERRED EMBODIMENTS

This method for optimized filling holes and manufacturing fine lines on a printed circuit board includes steps of:

(a) A copper clad substrate including a prepreg layer overlaid with a copper foil and a first dry film on the copper foil is provided. The copper clad substrate has a blind hole at a predetermined position and has an upper opening with an insulative inner wall. The first dry film is patterned corresponding to the upper opening and insoluble in a non-alkaline solution. The procedure of drilling-hole can be carried out before or after the procedure of laminating the first dry film. The copper clad substrate may be a core layer or a build-up layer laminated on the core layer or another build-up layer. For a core layer, copper is preferably plated on the bottom of a through hole or a blind hole before filling them. In addition, fine lines can be plated between the procedure of drilling-hole and the procedure of laminating the first dry film.

(b) Before filling the blind holes, the insulative inner walls thereof should be metallized through modification with reduced graphene oxide (rGO). Meanwhile, an rGO layer could be formed on insulative material outside of the hole, for example, the first dry film.

(c) The copper clad substrate is then placed in an electrolyte bath to deposit copper in the blind holes through an electroplating process. Since rGO has a specific structure and superior electrical conductivity, the copper plating in the holes is compact and firm. A surface copper layer can be formed on the rGO layer over the first dry film.

(d) The surface copper layer can be removed by etching to expose the rGO layer, which is then removed with the first dry film by an acidic solvent.

(e) The copper foil overlaid areas where conductivity is undesired can be removed by etching so as to complete the filling-hole process.

This invention is exemplified by the following embodiments but not restricted thereby. In this description, the through hole or the blind hole indicates whether the copper clad substrate is drilled through or not.

EXAMPLE 1

Figure 1A:
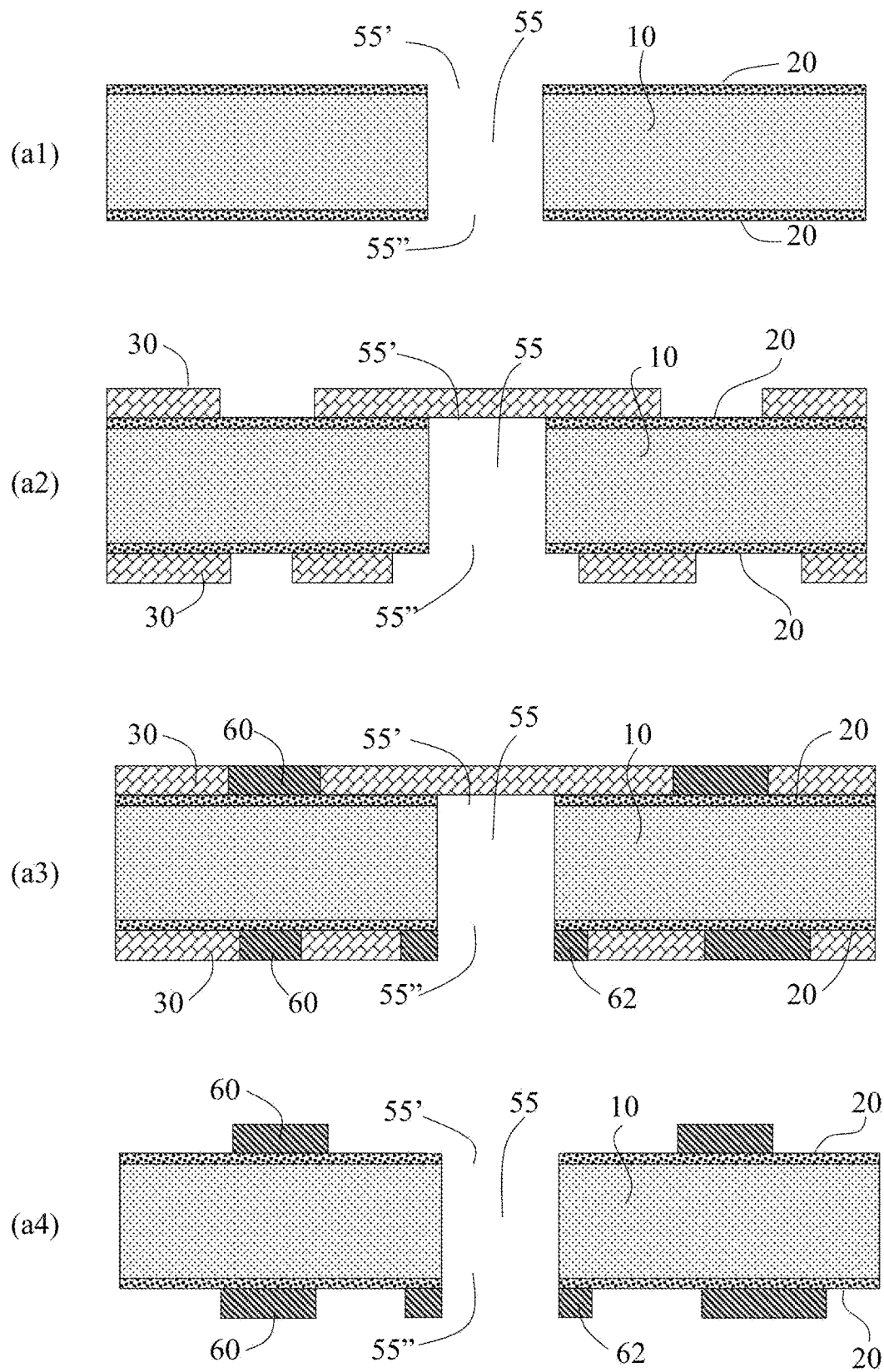
FIGS. 1A, 1B and 1C illustrate the structures of Example 1, in which the hole of the core copper clad substrate is filled after the fine lines are manufactured.
Figure 1B:
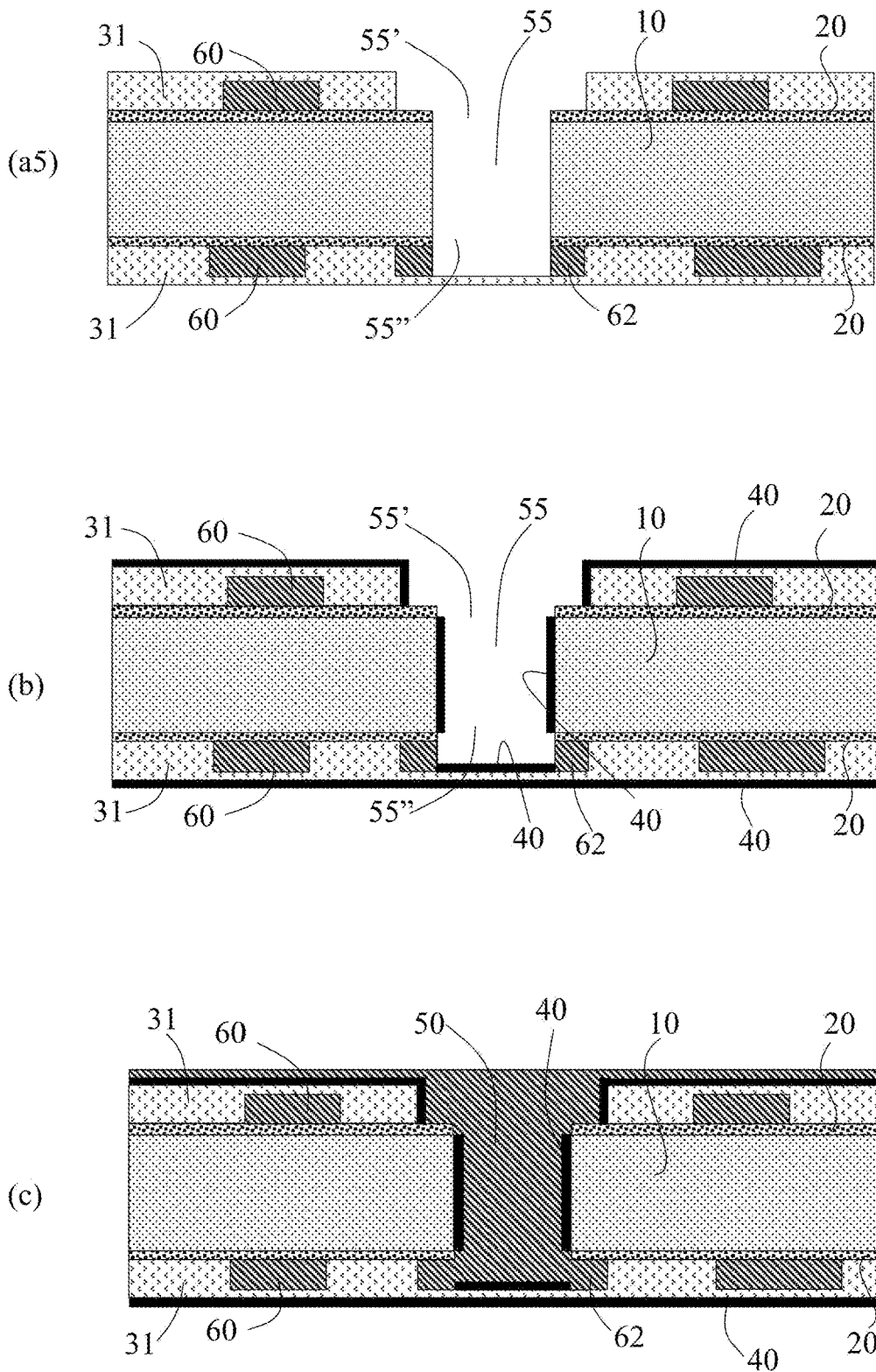
Figure 1C:
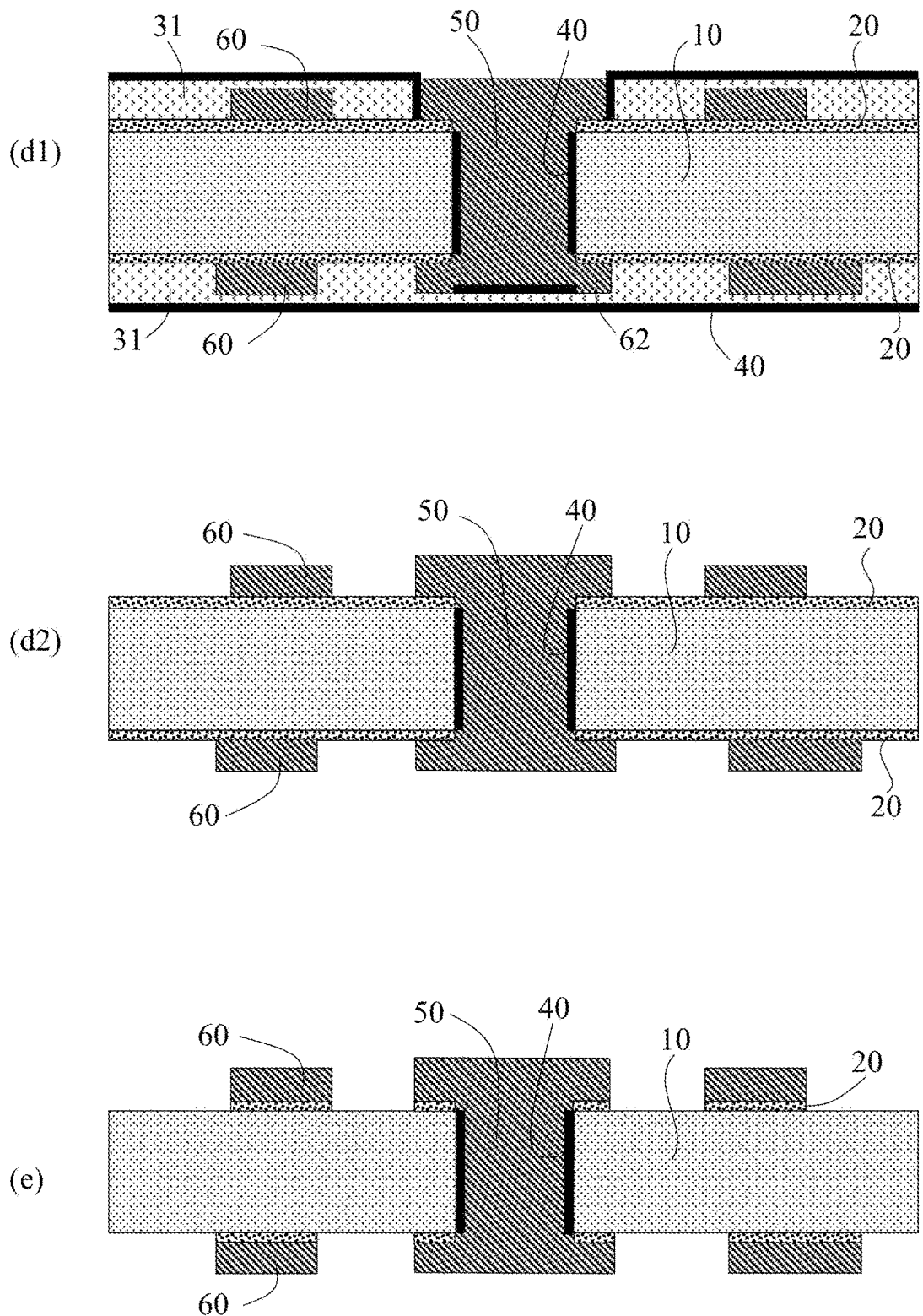
Figure 2A:
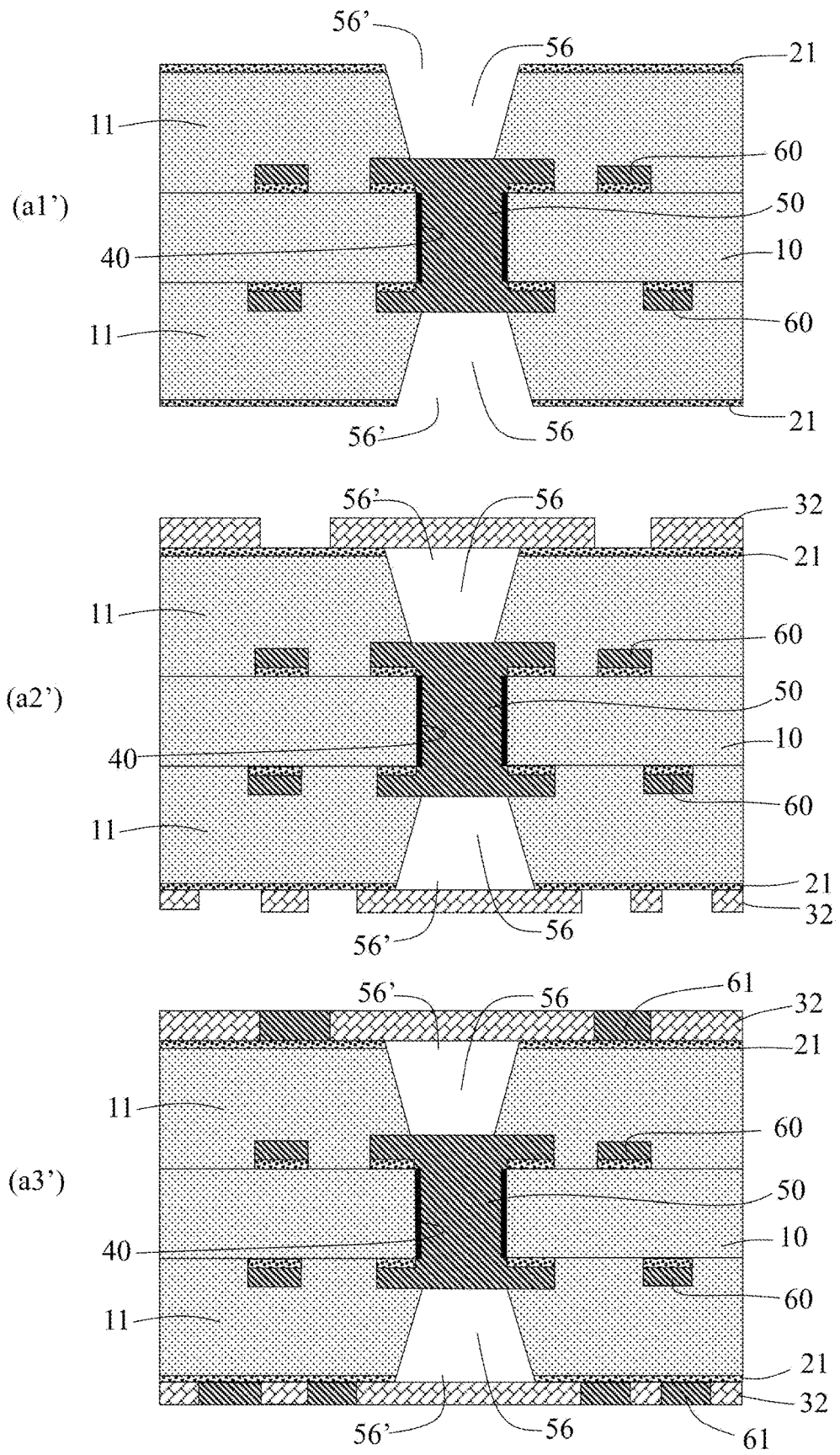
FIGS. 2A, 2B, 2C and 2D illustrate the structures of Example 1, in which the hole of the build-up copper clad substrate is filled after the fine lines are manufactured.
Figure 2B:
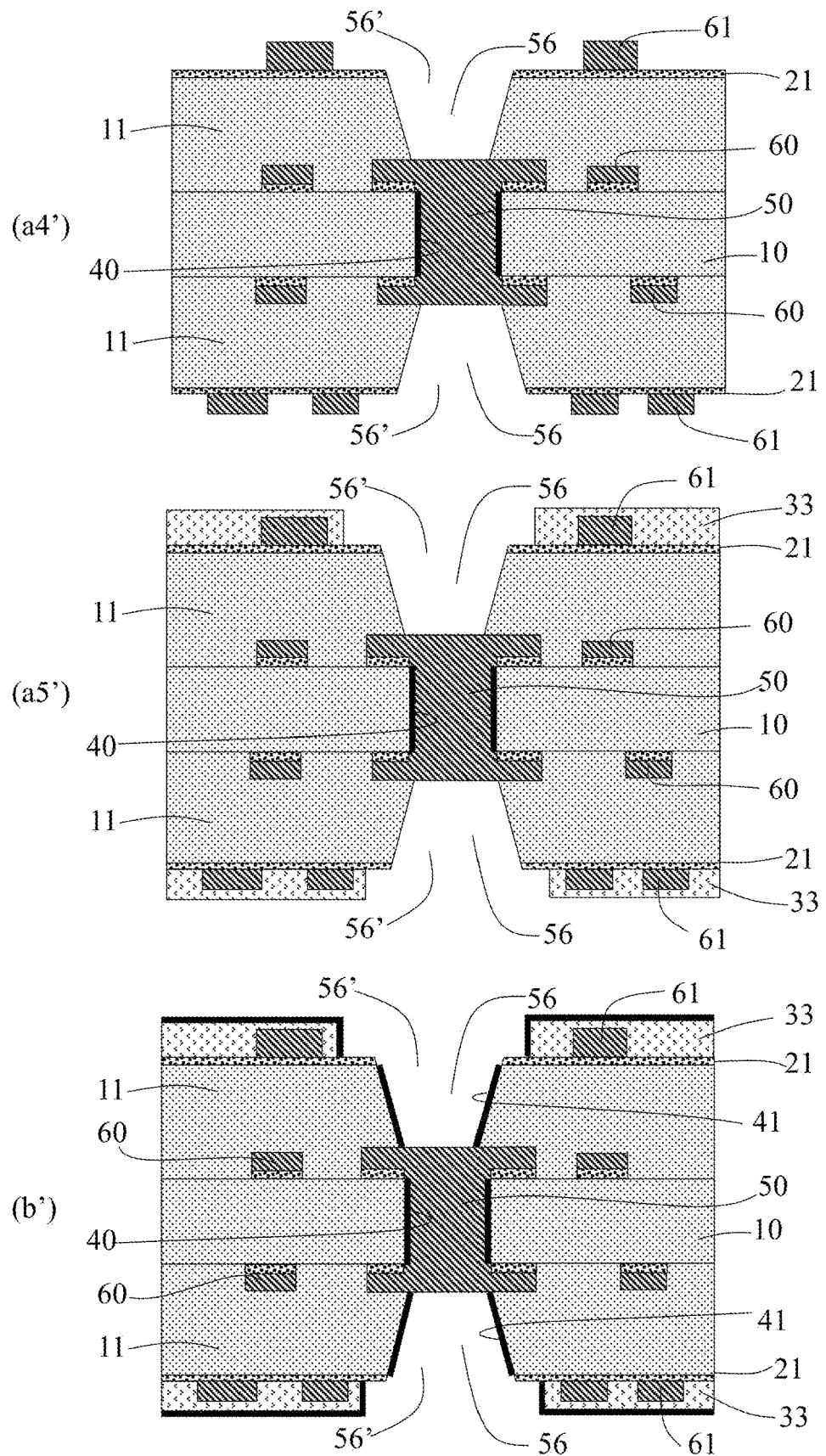
Figure 2C:
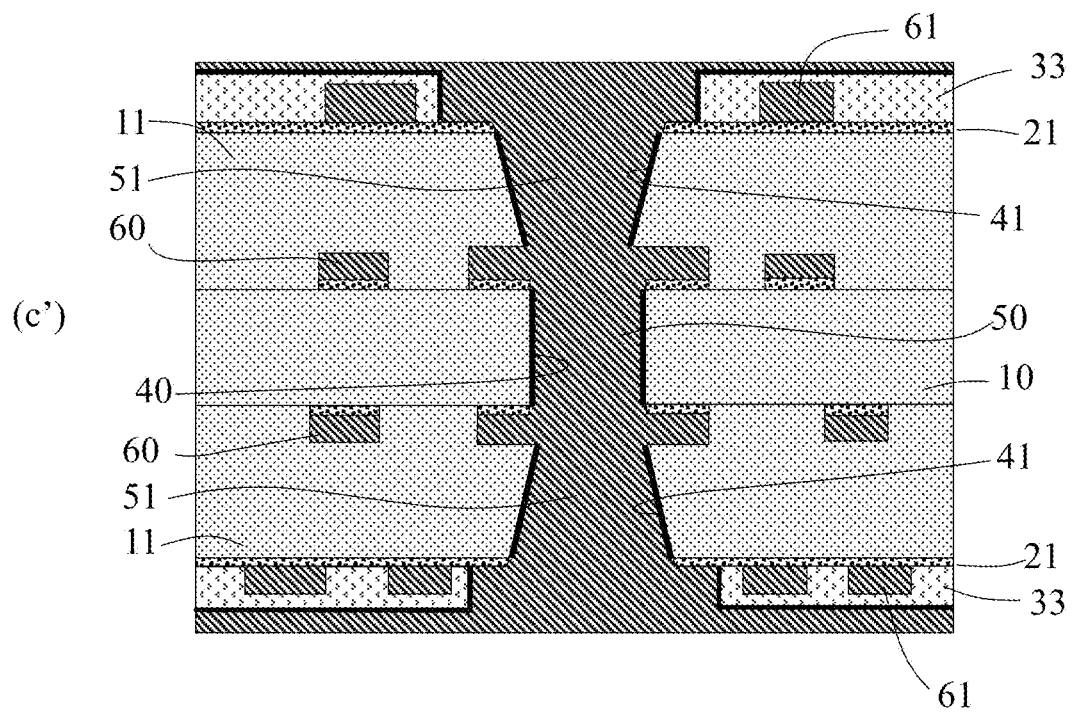
Figure 2C:
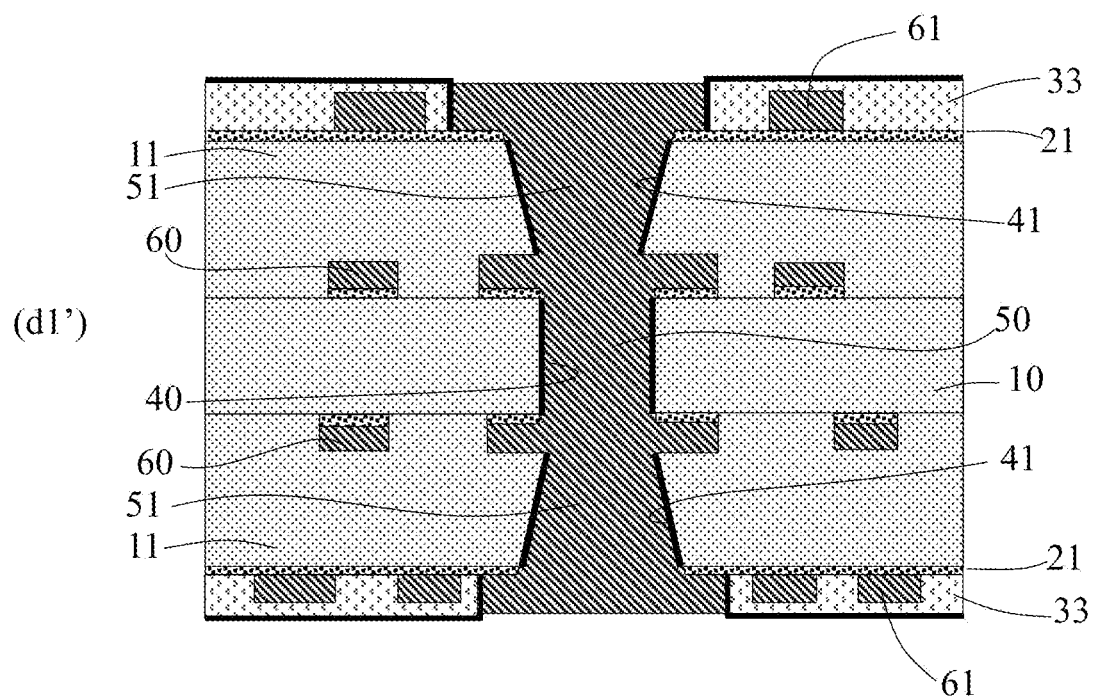
Figure 2D:
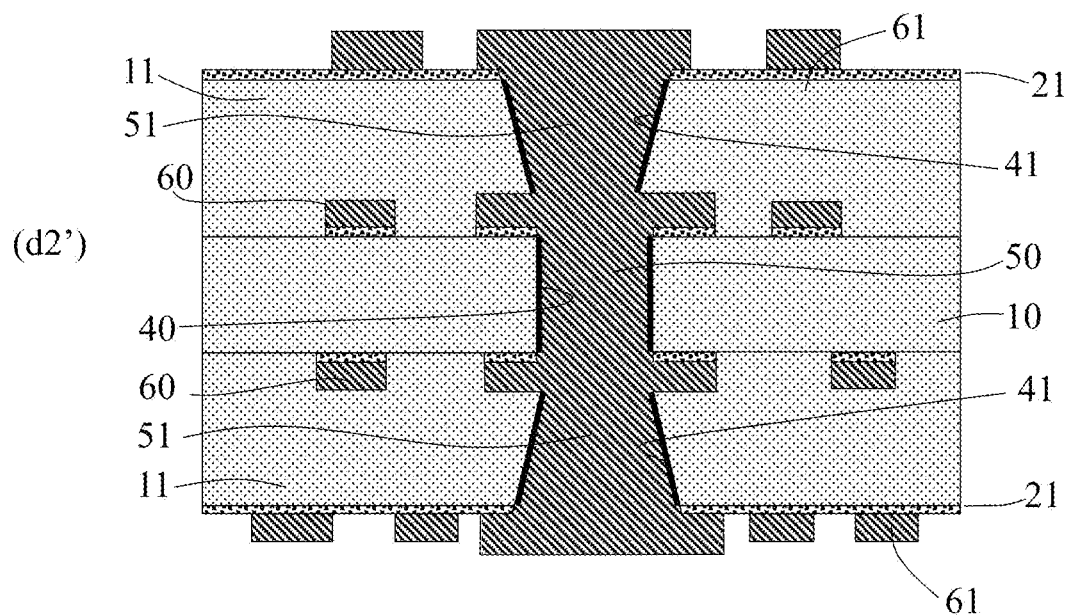
Figure 2D:
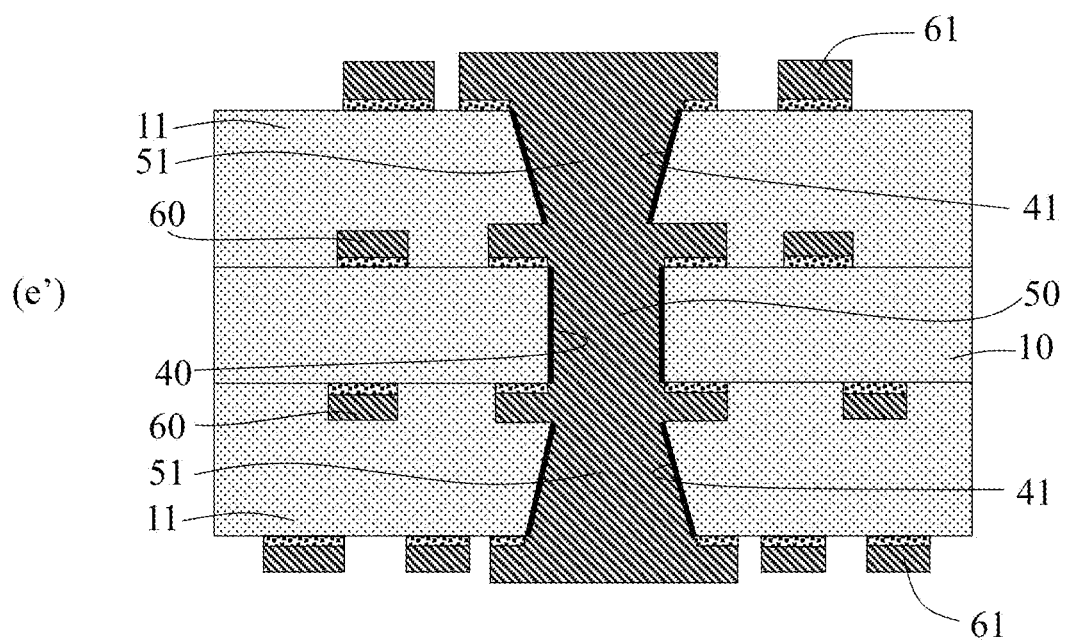

In Example 1, a hole is filled after the fine lines are manufactured. FIGS. 1A, 1B and 1C illustrate the core substrate and FIGS. 2A, 2B, 2C and 2D illustrate the build-up substrate.

In reference to FIGS. 1A, 1B and 1C, the procedures are as follows:

(a1) A copper clad substrate including a prepreg layer 10 overlaid with copper foils 20 on two opposite surfaces thereof is provided as a core substrate. The copper foils 20 have a thickness of 1 μm to 20 μm and the prepreg layer 10 has a thickness of 10 μm to 200 μm. The copper clad substrate is then drilled by laser drilling to form a through hole 55 at a predetermined position. The through hole 55 has a diameter of 50 μm to 200 μm, and defines an upper opening 55' and a lower opening 55" respectively near the copper foils 20.

(a2) The copper clad substrate is then cleaned and micro-etched, and a second dry film 30 is pressed on the copper foil 20 by a heating roller. Through procedures of UV exposing and developing with sodium carbonate, a circuit pattern and a lower opening pattern are formed in the second dry film 30. The lower opening pattern exposes an edge around the lower opening 55". The second dry film 30 is available from commercial suppliers and materials, for example, polyethylene (PE), polyester and photoresist. Such patterning procedures are well-known in the art.

(a3) The patterned substrate is then placed into an electrolyte solution to form copper-plating fine lines 60 in the circuit pattern and a copper-plating ring 62 at the edge around the lower opening 55" by the periodic pulse reverse (PPR) electroplating procedure. The PPR electrolyte solution includes copper sulfate ($CuSO_4$, 80 g/L), sulfuric acid ($H_2SO_4$, 200 g/L), chloride ions (100 ppm) and additives supplied from SCHLOETTER™ AF series products. The positive current density is 1 ASD to 3 ASD, the ratio of positive to reverse currents is 1:2 or 1:3 and the ratio of positive to reverse plating time is 20:1. The operating conditions can be adjusted according to required specification of the fine lines.

(a4) The second dry film 30 is stripped.

(a5) Next, first dry films 31 are attached on opposite surfaces of the substrate by a vacuum laminator and then patterned corresponding to the upper opening 55' to form a blind hole. This pattern has a larger diameter than that of the upper opening 55' to expose the copper foil 20 around the edge thereof.

(b) The substrate is then immersed in an aqueous solution of a conditioner (polyvinylimidazole, PVI) to form a PVI polymer layer on the inner wall and bottom of the hole 55 and the first dry film 31. Next, the substrate is immersed in an aqueous solution of graphene oxide (GO) which is then absorbed and bound with the PVI layer. The substrate is then placed in an aqueous solution of a reducing agent to reduce GO and form a reduced graphene oxide (rGO) layer 40. The rGO layer 40 shown in the figures factually has a negligible thickness. Since rGO has excellent electrical conductivity the inner wall of the hole can be well metallized. In this procedure, only acidic ingredients are applied to avoid the first dry film 31 stripping from the substrate. In step (b), the conditioner solution has a concentration of 4 g/L to 10 g/L and pH value of 3 to 5 at 30° C. to 40° C. The GO solution has a concentration of 0.1 g/L to 1 g/L and pH value of 2 to 4 at 20° C. to 45° C., and preferably has a concentration of 0.5 g/L to 1 g/L and pH value of 3 to 4 at room temperature.

The substrate is immersed for 1 minute to 10 minutes, then rinsed with water and dried. The reducing agent is acidic, for example, SCHLOETTER™ SLOTOGO 3730, SnCl2, ascorbic acid and hydriodic acid (HI). The substrate is immersed in the reducing agent solution having a pH value of 2 to 6 for 20 minutes to 30 minutes at 50° C. to 60° C. The concentration ranges from 0.01M to 1M dependent on the reducing agents. The conditioner can be polyamines or quaternary ammonium compounds, for example, SCHLOETTER™ SLOTOGO 3710 series product, SLO-TOSIT PCB 3510 series product, polyquaternium-2 (PQT-2), quaternary polyvinylimidazole (PVI), polyethyleneimine (PEI), poly(diallyldimethylammonium chloride) (PDACH), polyamidoamine-epichlorohydrin (PAE) or hyperbranched gemini quaternary ammonium salt (PN-320).

(c) The substrate is cleaned with an acid cleaner (SCHLOETTER™ SLOTOCLEAN S20, 0.5-5%, 15° C. to 30° C., 3 minutes to 10 minutes) to eliminate the surface impurities. After it is rinsed with water, the substrate is immersed in a micro-etching solution (SCHLOETTER™ SLOTOETCH 584, 10 g/L to 40 g/L, 15° C. to 30° C., 3 minutes to 10 minutes) to form a coarse surface. The cleaned substrate is then immersed in an electroplating bath. Copper is deposited in the through hole 55 to form a copper-plating filling 50, and further on the copper foil around the edge of the upper opening 55'. A surface copper layer is also formed on the rGO layer 40 over the first dry film 31. The electroplating procedure can be performed by continuous-line, gantry-line or horizontal-line equipment. For example, SCHLOETTER™ Agesfol, S-Cell test barrel and continuous-line electroplating equipment. The electrolyte solution including $CuSO_4$ (220 g/L), $H_2SO_4$ (40 g/L), chloride ions (60 ppm), additives (carriers, brighteners and levelers) are available from SCHLOETTER™ SLOTOCOUP series products. The electroplating procedure is performed with a current density of 0.5 ASD to 5.0 ASD for 30 minutes to 150 minutes in an electricity consumption of 0.25 Ah to 5 Ah. While the operating current and time are varied according to required specifications of the product, this procedure is obviously economic.

(d1) The surface copper layer on the rGO layer 40 over the first dry film 31 is removed by etching to expose the rGO layer 40.

(d2) The exposed rGO layer 40 and the first dry film 31 are then stripped with an alkaline solution of KOH or NaOH to expose a part of the copper foil 20.

(e) The exposed copper foil 20 is then removed by etching, and the copper-plating fine lines 60 and the copper-plating filling 50 are completed.

On the core substrate of step (e), the build-up substrates can be further laminated to provide expanded fine lines and the copper-plating filling 50 serves as an interconnect. The procedures are as follows:

(a1') Two build-up copper clad substrates each including a prepreg layer 11 and a copper foil 21 overlaid on one side thereof are laminated on opposite surfaces of the core substrate of step (e). The prepreg layers 11 and the copper foils 21 are drilled at the position corresponding to the copper-plating filling 50 to form blind holes 56 having upper openings 56'. Bottoms of the blind holes 56 are the copper-plating filling 50.

(a2') Surfaces of the copper clad substrates are cleaned, microetched and laminated with second dry films 32 which are the same as the second dry films 30 in FIG. 1A. Through the UV exposing and developing procedures, circuit patterns are formed in the second dry films 32.

(a3') The PPR electroplating procedure is carried out on the substrate to deposit copper in the circuit patterns and form the copper-plating fine lines 61.

(a4') The second dry film 32 is stripped.

(a5') Next, first dry films 33 are attached on the surfaces of the copper foil 21 by a vacuum laminator and then patterned corresponding to the upper openings 56'. These patterns have a larger diameter than those of the upper openings 56' to expose the copper foils around the edges thereof. The first dry films 33 are the same as the first dry film 31 and dissoluble in an alkaline solution.

(b') The substrate is then immersed in an aqueous solution of a conditioner (polyvinylimidazole, PVI) to form a PVI polymer layer on the inner wall and bottom of the blind holes 56 and the first dry films 33. Next, the substrate is immersed in an aqueous solution of graphene oxide (GO) which is then absorbed and bound with the PVI layer. The substrate is then placed in an aqueous solution of a reducing agent to reduce GO and form reduced graphene oxide (rGO) layers 41.

In this procedure, only acidic ingredients are applied to avoid the first dry films 33 stripping from the substrate.

(c') The substrate is cleaned with an acid cleaner to eliminate the surface impurities. After it is rinsed with water, the substrate is immersed in a micro-etching solution to form a coarse surface. The cleaned substrate is then immersed in an electroplating bath. Copper is deposited in the blind holes 56 to form copper-plating fillings 51, and further on the copper foils 21 around the edge of the upper openings 56'. Surface copper layers are also formed on the rGO layer 41 over the first dry films 33.

Since the copper-plating fillings 51 are continuously deposited from the bottoms of the blind holes 56, i.e. the copper-plating filling 50, interconnection between the substrates is formed.

(d1') The surface copper layers on the rGO layer 41 over the first dry films 33 are removed by etching to expose the rGO layer 41.

(d2') The exposed rGO layers 41 and the first dry films 33 are then stripped with an alkaline solution of KOH or NaOH to expose a part of the copper foils 21.

(e') The exposed copper foils 21 are then removed by etching, and the copper-plating fine lines 61 and the copper-plating fillings 51 are completed.

By repeating the steps (a1') to (e'), a multi-substrate structure is formed and the interconnections between the substrates can be achieved through the copper-plating fillings.

EXAMPLE 2

Figure 3:
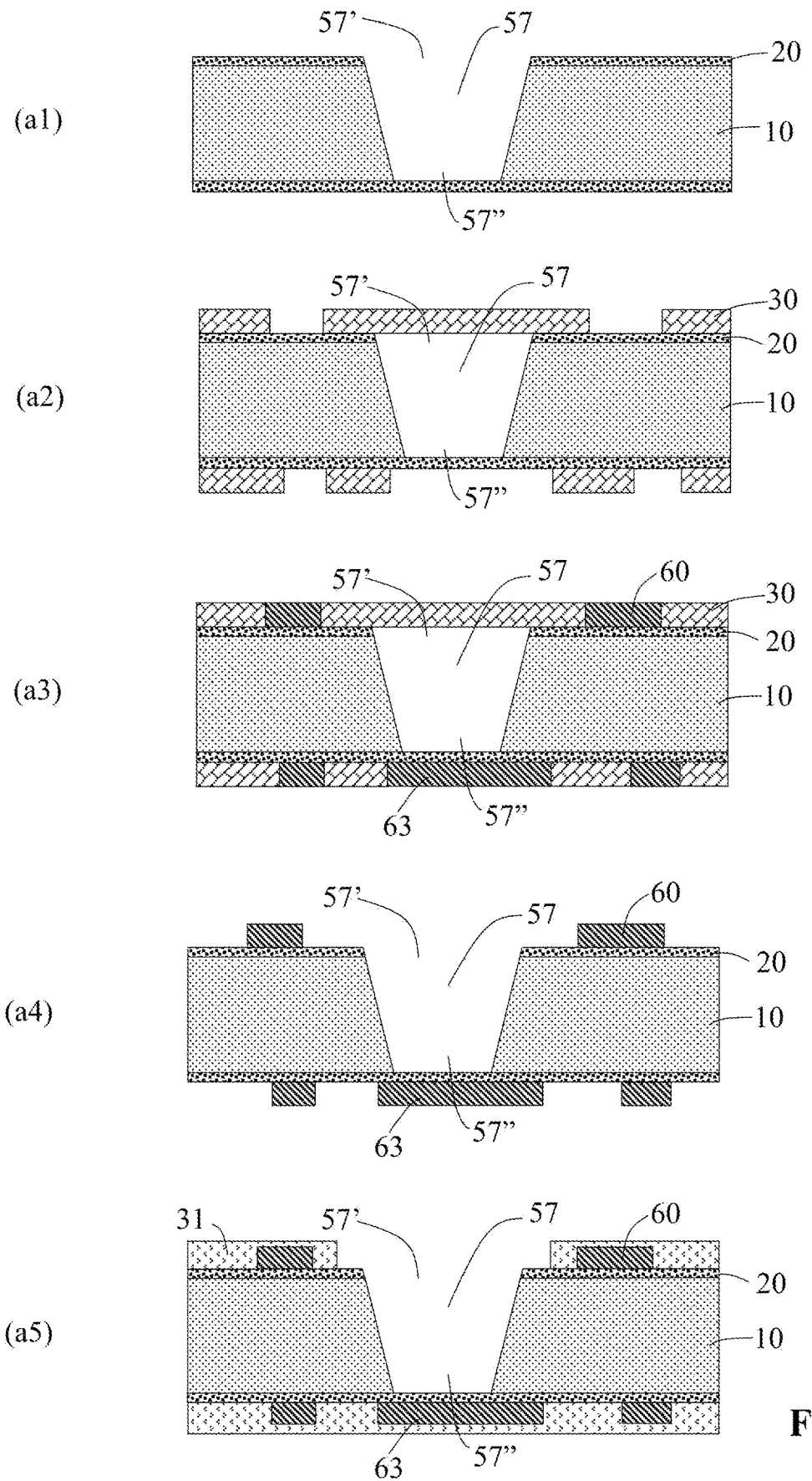
FIG. 3 illustrates the structures of Example 2, in which the fine lines and the bottom of the blind hole of the core copper clad substrate are manufactured.

FIG. 3 illustrates the structures of Example 2 using procedures similar to Example 1, except that the copper clad substrate is not drilled through in the beginning.

(a1) A copper clad substrate including a prepreg layer 10 overlaid with copper foils 20 on two opposite surfaces thereof is provided. The copper clad substrate is then drilled by laser drilling to form a blind hole 57 at a predetermined position. The blind hole 57 has an upper opening 57' and a bottom 57".

(a2) The copper clad substrate is then cleaned and micro-etched, and a second dry film 30 is pressed on the copper foil 20 by a heating roller. Through procedures of UV exposing and developing with sodium carbonate, a circuit pattern and a bottom pattern are formed in the second dry film 30. The bottom pattern has a diameter larger than that of the bottom 57".

(a3) The PPR electroplating procedure is carried out on the substrate to deposit copper in the circuit pattern and the bottom pattern to form the copper-plating fine lines 60 and the copper-plating set 63.

(a4) The second dry film 30 is stripped.

(a5) Next, first dry films 31 are attached on opposite surfaces of the substrate by a vacuum laminator and then patterned corresponding to the upper opening 57' to form a blind hole. This pattern has a larger diameter than that of the upper openings 57' to expose the copper foil 20 around the edge thereof.

The subsequent procedures for rGO modification and electroplating can be referred to Example 1.

EXAMPLE 3

Figure 4A:
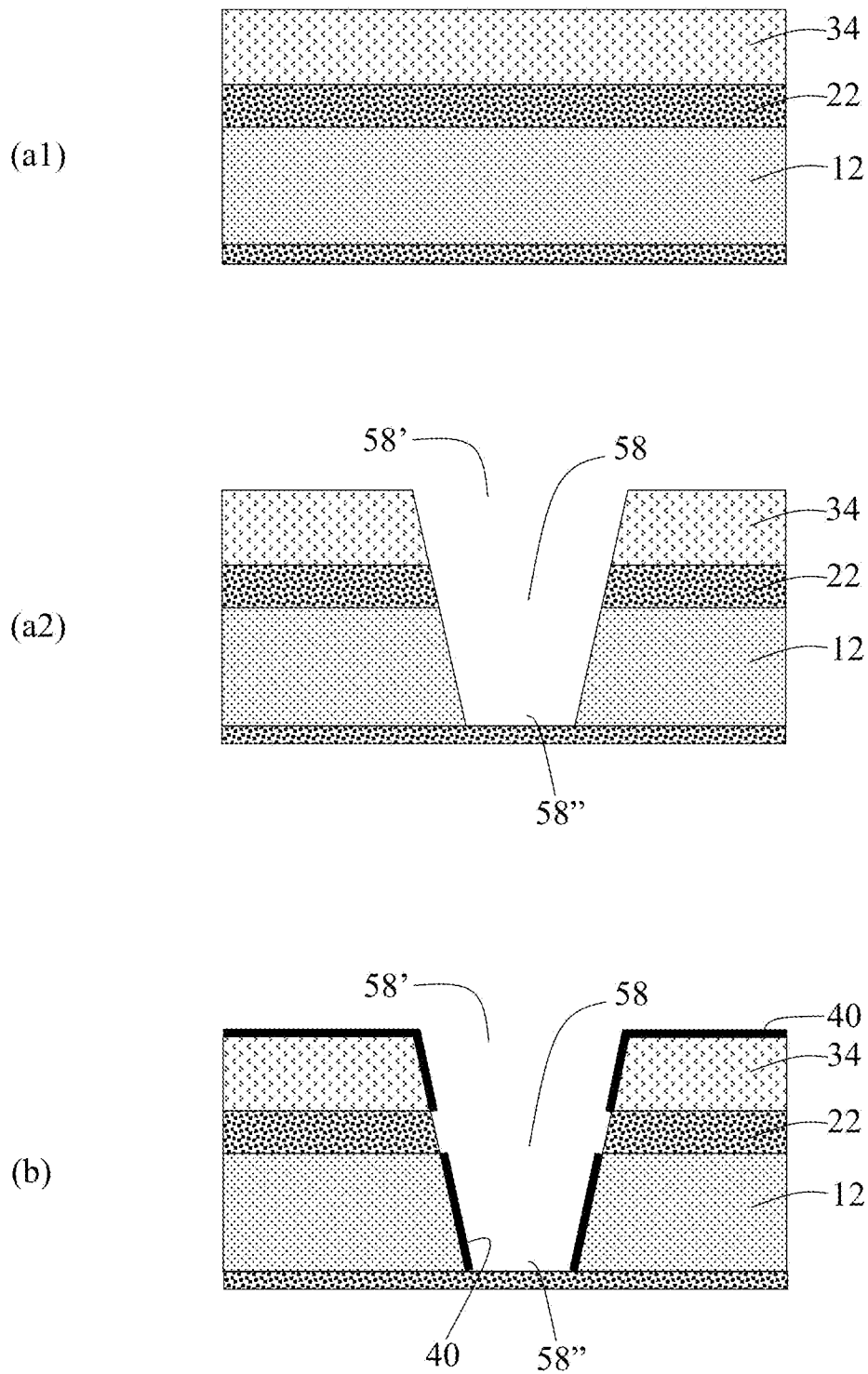
FIGS. 4A, 4B and 4C illustrate the structures of Example 3, in which the hole is filled before the fine lines are manufactured.
Figure 4B:
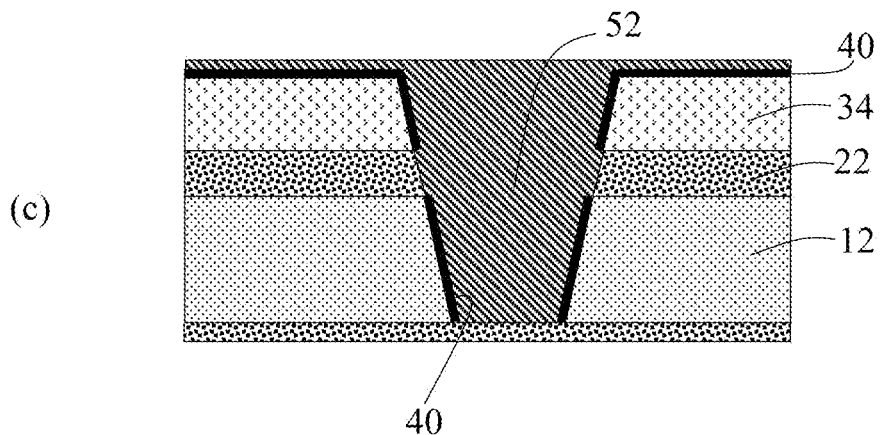
Figure 4B:
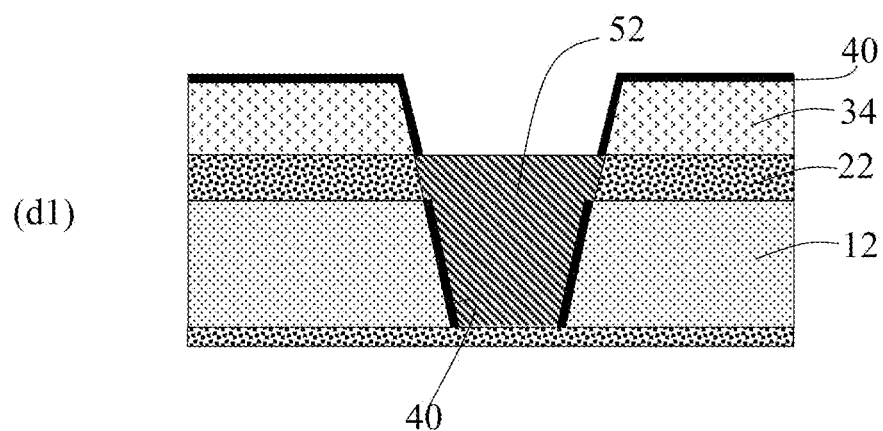
Figure 4B:
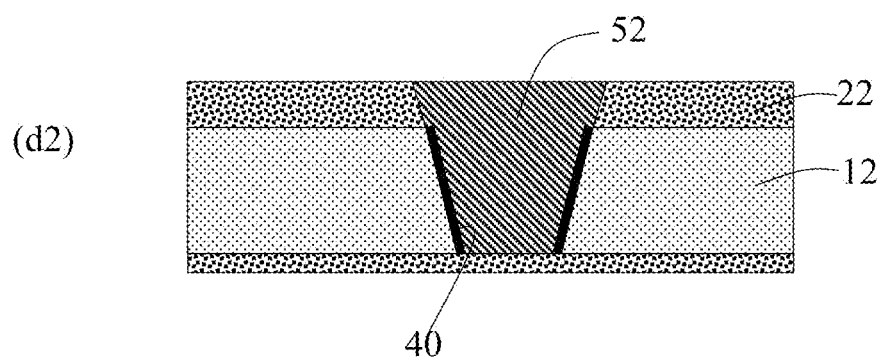
Figure 4C:
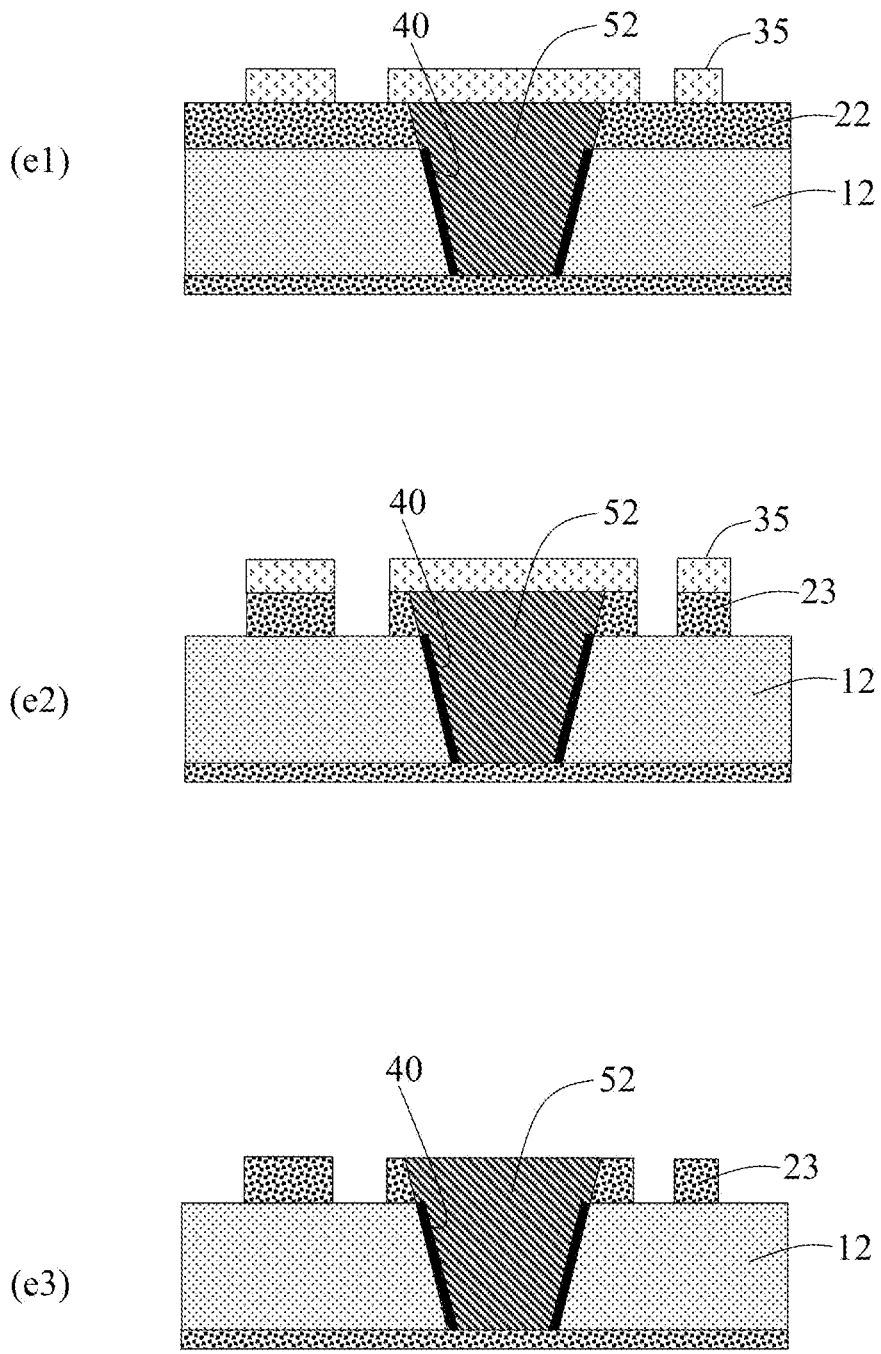

FIGS. 4A, 4B and 4C illustrate the structures of Example 3, in which the hole is filled before fine lines are manufactured.

Example 3 is different from Examples 1 and 2 in that the first dry film is laminated before drilling the hole and the fine lines are formed after filling the hole.

(a1) A copper clad substrate including a prepreg layer 12 overlaid with copper foils 22 on opposite surfaces thereof is provided. A first dry film 34 is laminated on the upper one of the copper foils 22.

(a2) The substrate is drilled unto the lower one of the copper foils 22 and thus form a blind hole 58 having an upper opening 58' and a bottom 58". The substrate is then cleaned by plasma to eliminate residues.

(b) The substrate, mainly the inner wall of the blind hole 58, is then modified with reduced graphene oxide (rGO) to form an rGO layer 40.

(c) The substrate is then cleaned and micro-etching solution to form a coarse surface. The cleaned substrate is then immersed in an electroplating bath. Copper is deposited in the blind holes 58 from the lower copper foil 22 to form a copper-plating filling 52. A surface copper layer is also form on the rGO layer 40 over the first dry film 34.

(d1) The surface copper layer on the rGO layer 40 over the first dry films 34 is removed by etching to expose the rGO layer 40.

(d2) The exposed rGO layers 40 and the first dry films 34 are then stripped with an alkaline solution of KOH or NaOH.

(e1) A second dry film 35 is laminated on the substrate and patterned to expose undesired copper foil 22, i.e. the area of fine lines and copper-plating hole 52 are covered.

(e2) The exposed copper foil 22 is then removed by etching and the fine lines 23 are obtained.

(e3) The second dry film 35 is stripped so that the fine lines 23 and the copper-plating filling 52 are achieved.

Summarily, the present invention has the following advantages or features:

1. The process is optimized by separately completing procedures of filling hole and manufacturing fine lines whereby their operating conditions can be independently considered.

2. The PPR electroplating process can be applied to manufacture the fine lines. The electrolyte solution contains cupric ions of lower concentrations and an acid of higher concentrations. As a result, the overall thickness of the copper layers is conformed and the profiles of the fine lines are square.

3. The method according to the present invention does not use traditional metallization processes such as chemical copper and Shadow are carried out in an alkaline solution in which the dry films are dissoluble and therefore improper.

4. In this invention, the inner wall of the hole can be modified/metalized with rGO in an acidic solution in which the dry film is insoluble and the current can be delivered from the bottom in the subsequent electroplating process. In addition, electrical conductivity of rGO can be controlled by adjusting operating conditions of the metallization process. As a result, the overall thickness of the copper layers is conformed as the surface copper layer formed during electroplating is much less, and the copper-plating filling is evenly compact without voids as the current is focused to fill the blind hole.

5. When comparing the present invention with the inventors' earlier application, TW App. No. 106113528, differences between them are:

(1) In the earlier application, a thin surface copper plating as a lower part of fine lines is formed during filling of the blind hole. That is, different operating conditions are considered. In the present invention, the additives added in the electrolyte solution can be adjusted within a larger range to achieve super filling and less surface copper plating.

(2) In the earlier application, the fine lines are plated on the surface copper plating by the PPR electroplating process so that the fine lines having an aspect as low as 15 μm/15 μm is hardly achieved. In the present invention, only the thickness of the copper foils is considered for etching and therefore it's quite easy to form fine lines having an aspect lower than 15 μm/15 μm.

6. When comparing the present invention with the inventors' another earlier application, TW App. No. 105134459, differences between them are as follows:

(1) In the earlier application, the blind hole is padless to save space for fine lines and the substrate is not overlaid with a copper foil similar to the additive process of PCBs.

(2) In the earlier application, the substrate is plated after metallization to fill holes and form the surface copper plating which is then etched to obtain fine lines. In the present invention, the substrate is overlaid with copper foil(s) and the fine circuit pattern is formed in the dry film for further etching.

The invention claimed is:

1. A method for optimized filling holes on a printed circuit board, comprising steps of:
(a) providing a copper clad substrate including a prepreg layer overlaid with a copper foil and a first dry film laminated on the copper foil, in which a blind hole with an insulative inner wall is formed at a predetermined position and defines an upper opening, wherein the first dry film is patterned corresponding to the upper opening and insoluble in a non-alkaline solution;
(b) modifying the insulative inner wall of the blind hole with reduced graphene oxide (rGO);
(c) depositing copper in the blind hole through an electroplating process to form a copper-plating hole;
(d) removing the first dry film to expose the copper foil;
(e1) laminating and patterning a second dry film on the substrate by covering areas of fine lines and the copper-plating hole;
(e2) removing portions of the copper foil that are not masked by the second dry film; and
(e3) removing the second dry film.

2. The method of claim 1, wherein the blind hole of step (a) is formed by a step of:
drilling a hole in the copper clad substrate overlaid with the copper foil and laminated with the first dry film on the copper foil at the predetermined position.

3. The method of claim 1, wherein the step (b) comprises forming a polymer layer on the first dry film and the insulative wall of the blind hole, then modifying the polymer layer with graphene oxide (GO), and finally reducing the GO to form a reduced GO (rGO) layer.

4. The method of claim 3, wherein the step (c) further comprises depositing copper on the rGO layer on the first dry film to form a surface copper layer.

5. The method of claim 4, wherein the step (d) further comprises steps of:
- removing the surface copper layer to expose the rGO layer on the first dry film; and
- removing the rGO layer on the first dry film before removing the first dry film.

6. A method for optimized filling holes and manufacturing fine lines on a printed circuit board, comprising steps of:
- (a1) providing a copper clad substrate overlaid with a copper foil and drilling a hole at a predetermined position, wherein the hole has an upper opening with an insulative inner wall;
- (a2) laminating a second dry film on the copper foil and forming a circuit pattern corresponding to designed fine lines;
- (a3) depositing copper in the circuit pattern through an electroplating process;
- (a4) removing the second dry film;
- (a5) laminating a first dry film on the copper foil and patterning the first dry film corresponding to the upper opening to form a blind hole, wherein the first dry film is insoluble in a non-alkaline solution;
- (b) modifying the insulative inner wall of the blind hole with reduced graphene oxide (rGO);
- (c) depositing copper in the blind hole through an electroplating process;
- (d) removing the first dry film; and
- (e) removing exposed copper foil.

7. The method of claim 6, wherein:
- in step (a1), the copper clad substrate is overlaid with copper foils on opposite surfaces thereof and the hole is a through hole with a lower opening or a blind hole with a bottom at a predetermined position;
- in step (a2), a second dry film is laminated on each of the copper foils and patterned corresponding to an edge of the lower opening or the bottom; and
- in step (a3), copper is deposited on the edge of the lower opening or in the bottom through an electroplating process.

8. The method of claim 6, wherein the first dry film of the step (a5) is patterned to expose an edge of the copper foil around the upper opening, and copper is deposited on the edge of the upper opening in the step (c).

9. The method of claim 6, wherein the step (b) includes forming a polymer layer on the first dry film and the insulative wall of the blind hole, then modifying the polymer layer with graphene oxide (GO), and finally reducing the GO to form a reduced GO (rGO) layer.

10. The method of claim 9, wherein the step (c) further comprises depositing copper on the rGO layer on the first dry film to form a surface copper layer.

11. The method of claim 10, wherein the step (d) further comprises removing the surface copper layer to expose the rGO layer on the first dry film and then removing the rGO layer on the first dry film before removing the first dry film.

* * * * *